(12) United States Patent  (10) Patent No.: US 8,018,219 B2
Calcaterra et al.  (45) Date of Patent: Sep. 13, 2011

(54) METHOD AND APPARATUS FOR MULTIPLE ELECTRICAL CIRCUIT MAPPING

(75) Inventors: Jeffrey Alan Calcaterra, Chapel Hill, NC (US); Steven Michael Miller, Cary, NC (US); Humberto Gutierrez-Rivas, Chapel Hill, NC (US)

(73) Assignee: International Business Machines Corporation, Armonk, NY (US)

( * ) Notice: Subject to any disclaimer, the term of this patent is extended or adjusted under 35 U.S.C. 154(b) by 608 days.

(21) Appl. No.: 12/119,177

(22) Filed: May 12, 2008

(65) Prior Publication Data

US 2009/0278524 A1 Nov. 12, 2009

(51) Int. Cl.
G01R 19/00 (2006.01)
(52) U.S. Cl. ........................................................ 324/66
(58) Field of Classification Search ................ 324/66
See application file for complete search history.

(56) References Cited

U.S. PATENT DOCUMENTS

| | | | |
|---|---|---|---|
| 3,623,142 A | 11/1971 | Key | |
| 3,902,026 A * | 8/1975 | Rogers et al. | 340/825.36 |
| 4,121,152 A | 10/1978 | Hale et al. | |
| 4,734,638 A | 3/1988 | Weber | |
| 4,801,868 A | 1/1989 | Brooks | |
| 4,906,938 A | 3/1990 | Konopka | |
| 5,109,200 A | 4/1992 | Dushane et al. | |
| 5,270,658 A | 12/1993 | Epstein | |
| 5,331,283 A | 7/1994 | Sheldon | |
| 5,352,985 A | 10/1994 | Simon | |
| 5,422,564 A | 6/1995 | Earle et al. | |
| 5,493,206 A | 2/1996 | Boons | |
| 5,497,094 A | 3/1996 | George | |
| 5,699,051 A | 12/1997 | Billig et al. | |
| 5,812,352 A | 9/1998 | Rokita et al. | |
| 5,969,516 A | 10/1999 | Wottrich | |
| 6,054,931 A | 4/2000 | Wottrich | |
| 6,154,032 A | 11/2000 | Coia et al. | |
| 6,163,144 A | 12/2000 | Steber et al. | |
| 6,166,532 A | 12/2000 | Coia et al. | |
| 6,222,358 B1 | 4/2001 | Wottrich | |
| 6,297,729 B1 | 10/2001 | Abali et al. | |
| 6,360,177 B1 | 3/2002 | Curt et al. | |
| 6,392,395 B2 | 5/2002 | Roberts et al. | |
| 6,466,029 B2 | 10/2002 | Stroth et al. | |
| 6,798,209 B2 | 9/2004 | Lavoie et al. | |
| 6,933,712 B2 | 8/2005 | Miller et al. | |
| 7,030,624 B1 | 4/2006 | Love | |
| 7,030,734 B2 * | 4/2006 | Butler et al. | 340/3.43 |
| 7,057,401 B2 | 6/2006 | Blades | |
| 7,068,038 B2 * | 6/2006 | Mason et al. | 324/508 |
| 7,127,041 B1 * | 10/2006 | Houck | 379/25 |
| 7,157,896 B2 | 1/2007 | Konopka | |
| 7,167,078 B2 | 1/2007 | Pourchot | |
| 7,274,184 B1 | 9/2007 | McCasland et al. | |
| 7,554,454 B2 * | 6/2009 | Johnson et al. | 340/635 |
| 2007/0139055 A1 * | 6/2007 | Cockrill | 324/528 |

* cited by examiner

Primary Examiner — Jeff Natalini
(74) Attorney, Agent, or Firm — Steven E. Bach

(57) ABSTRACT

A module is provided for identifying outlets on a common power circuit. The module comprises a connector adapted to electrically couple with an outlet, a signal generator electrically connected to the connector and adapted to send a signal through the connector into a power circuit in response to a predetermined discrete event, an indicator; and logic electrically connected to the connector and the indicator and adapted to detect a signal from another apparatus propagated on a common circuit and activate the indicator in response to the signal.

16 Claims, 4 Drawing Sheets

METHOD AND APPARATUS FOR MULTIPLE ELECTRICAL CIRCUIT MAPPING

FIELD OF THE INVENTION

The invention relates to the field of electrical power systems and more particularly to an apparatus and method for identifying outlets on a common power circuit.

BACKGROUND

Detecting the electrical circuit that corresponds to an electrical outlet is a critical safety practice required for doing any major electrical work. Older houses and businesses have typically undergone numerous changes to their electrical systems over time, and the changes in some instances may be poorly or inaccurately documented. Also, circuit marking may become illegible on the circuit boxes. Moreover, especially in older buildings, the outlets in a single room may not all be on the same circuit, since electricians or other workers adding additional service may just tap into the nearest wire rather than trying to tap into the circuit that corresponds to other outlets in the room. As a result, detecting and mapping circuit breakers to outlets can be long and tedious process.

One method for mapping circuit breakers to outlets consists of flipping switches and yelling. In this scenario, one person flips all of the switches on the circuit-breaker box. Another person waits in another room and yells when the lights or other devices go off (i.e., lose power). They then double-check the circuits. This approach requires no technology, but it is time consuming. In addition to being time consuming, this approach requires two people for it to be practical.

Another approach is to use a commercially available device that connects to an outlet and sends a signal over the electrical line from the outlet to the circuit breaker. The electrician then moves a detector over the circuit breakers. The detector picks up the signal when it passes over the circuit for the outlet with the signaling device attached and typically lights up or emits a tone. While this approach can be carried out by one person and is less time consuming than the previous method for a single outlet, it is not efficient for mapping a larger number of outlets. This is because the detectors can not differentiate between signals sent from different modules, so multiple signal-sending modules cannot be detected in parallel. That is, if an electrician were to plug modules into multiple outlets that were not all on the same circuit, there would be no way to tell which outlets were on which circuit.

A method for collecting information about different outlets and consolidating the information into a hand-held computer is described in U.S. Pat. No. 7,057,401. This approach allows a technician to collect signals from multiple modules in parallel, but this approach is cumbersome, requiring that the outlets and circuit box be connected by an additional wire ("umbilical cord") that needs to be carried around the worksite. Moreover, this approach is expensive, due to the computer and the umbilical cord.

U.S. Pat. No. 6,466,029 provides a method for detecting the correct circuit interrupt device for a particular circuit by applying a signal generator at an outlet and sweeping a signal detector over circuit interrupt devices. This method only allows for one to one correlation of an outlet and a fuse or circuit breaker. Similarly, U.S. Pat. No. 5,493,206 provides a method and apparatus for determining a group to which a connection point forming part of an electrical installation belongs by installing a detector in place of a fuse and generating a signal at a connection point. This method only allows for one to one correlation of an outlet and a fuse or circuit breaker. This method is limited by the scalability of the number of connections that can be made simultaneously to the fuse box.

A method for determining which outlet is closer to a circuit breaker is described in U.S. Pat. No. 5,352,985. In this method a device measures a voltage drop over a wiring loop between neutral and earth contact terminals. This approach, however, only tells the electrician about the relative proximity to the circuit breaker after he knows that they are on the same circuit.

Each of the foregoing approaches requires setup time and an assortment of equipment. Moreover, in the foregoing approaches a circuit interrupt device is detected for a single outlet or connection point at a time. In some cases an electrician may wish to know which outlets are on the same circuit without an elaborate setup process. For example, he might want to determine if a device that should not be turned off (such as a refrigerator or a clock that is going to have to be reset) is going to be affected by turning off a circuit. He also might already know which circuit one outlet is on and want to quickly determine whether other outlets are on the same circuit.

SUMMARY

According to an exemplary embodiment of the present invention, a method is provided for identifying outlets on a common power circuit. In this method, two or more modules are plugged into outlets of interest to determine whether or not they are on the same circuit. The modules communicate in a peer-to-peer network over the electrical wiring forming an electrical circuit. This method may be carried out without traveling to the circuit box and without engaging in an elaborate setup.

Two or more modules are provided. These modules comprise connectors adapted to be connected to an outlet, a signal generator electrically connected to the connector and adapted to send a signal through the connector into a power circuit, an indicator, and logic electrically connected to the connectors and the indicator and adapted to detect a signal from another apparatus through a common circuit and activate the indicator in response to the signal. The modules are inserted into each of a plurality of outlets or associated with switches. A user activates the signal generator of a first one of the modules. The user then identifies outlets with modules with activated indicators as being on the same circuit as the first module.

BRIEF DESCRIPTION OF THE DRAWINGS

The features and advantages of the invention will be more clearly understood from the following detailed description of the preferred embodiments when read in connection with the accompanying drawing. Included in the drawing are the following figures.

DETAILED DESCRIPTION

Figure 1:
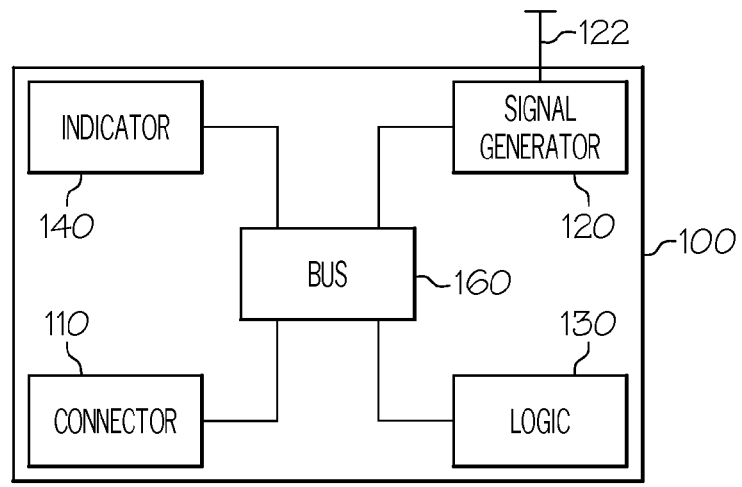
FIG. 1 is a block diagram of an apparatus for identifying outlets on a common power circuit according to an exemplary embodiment of the present invention.
Figure 2A:
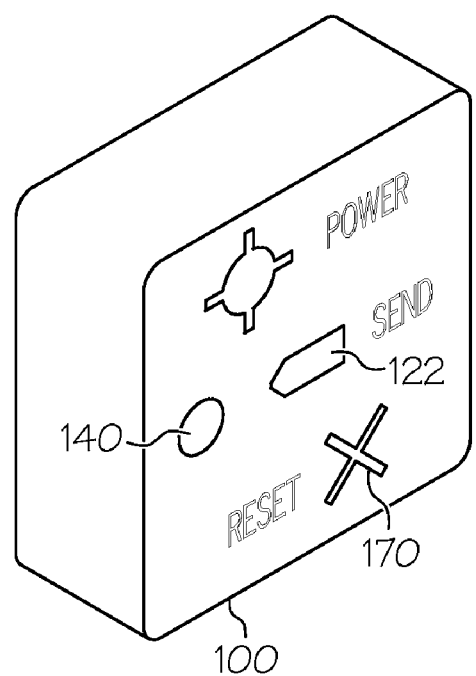
FIGS. 2A and 2B are isometric views of an apparatus for identifying outlets on a common power circuit according to an exemplary embodiment of the present invention.
Figure 2B:
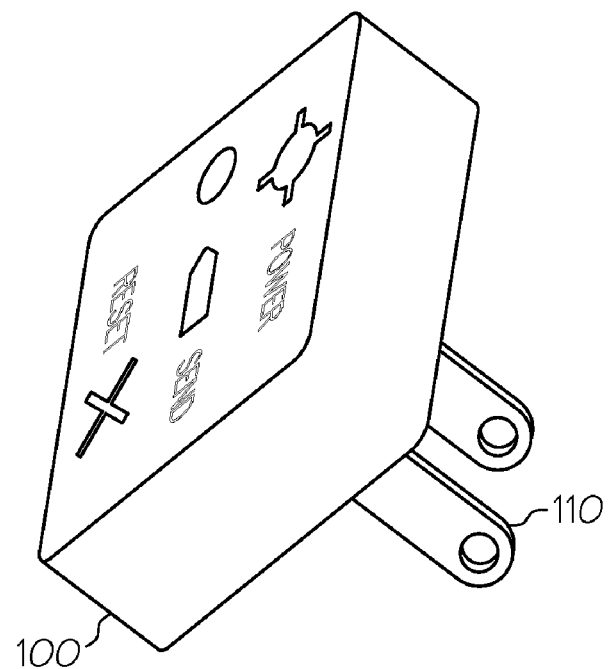

According to an exemplary embodiment, as shown in FIGS. 1, 2A, and 2B, the present invention provides a method and an apparatus for identifying outlets on a common power circuit. The apparatus comprises two or more modules 100 that may be electrically connected to outlets. An exemplary module 100 comprises a connector 110, such as a standard male electrical plug which is plugged into an outlet.

In an exemplary embodiment, the module 100 also comprises a signal generator 120 electrically connected to the connector 110. The signal generator 120 may be electrically connected to the connector 110 through a bus 160, for example. Alternatively, the signal generator 120 and connector 110 may be connected by direct wiring or other means suitable for providing electrical connection.

The signal generator 120 generates a test signal which may be propagated over conventional building electrical wiring through the connector 110. The signal generator 120 may be any device that generates a signal suitable for propagation over electrical wiring. Some examples of test signals suitable for use include a voltage signal, power line data, frequency modulation, or other forms of signals that can be transmitted over the wiring of an electrical circuit. Devices for generating these signals are known in the art and will not be described in detail.

The signal generator 120 generates a test signal in response to a discrete event. This discrete event may be, for example, plugging the module into an outlet. Alternatively, the discrete event may be activation of a triggering mechanism 122 such as depressing a button or the like that is mechanically connected to the signal generator or operably associated with the signal generator, such as through logic 130.

A test signal generated by a first module 100 propagates through the wiring of an electrical circuit to all of the other outlets on the same circuit, but does not propagate to other circuits which are electrically isolated from each other. The test signal enters any other modules 100 which are connected to outlets on the same circuit as the first module through their respective connectors 110. The test signal does not enter modules 100 that are installed in outlets on different circuits than the circuit in which the first module is installed and the test signal is propagated.

In each module 100, the connector 110 is electrically connected to a logic 130 which detects the signal. The logic 130 may be interconnected to the connector 110 through a bus, through direct wiring, or through any other suitable interconnecting means. Logic 130 may comprise a passive switch, a microprocessor, or any other electronic component or circuit suitable for detecting a signal and providing an output in response to the signal. Thus, the modules communicate on a peer-to-peer network to determine whether or not any modules are on the same circuit as the activated module, thereby determining whether or not the corresponding outlets are on the same circuit. It should be noted that in the present exemplary embodiment, this determination can be made without any setup or elaborate test procedure by simply plugging two or more modules into outlets of interest and activating one of the modules.

The logic 130 is electrically interconnected with an indicator 140. The logic may be interconnected with the indicator through a bus 160 as illustrated or through direct wiring or any other suitable electrical interconnection means. When the logic 130 detects the test signal, the logic 130 triggers the indicator 140.

Indicator 140 may be a light emitting diode (LED), as shown in FIGS. 2A and 2B. Alternatively, indicator 140 may be a sound transmitting device, a radio frequency (RF) transmitter, or any other device suitable for providing a discernable indicia to a person or to a computer which can use the indicia to identify modules (and therefore outlets) on the same circuit as the first module which sent the test signal.

In an exemplary embodiment, the module 100 comprises an optional reset feature 170. The reset feature may comprise a signal generator and logic to propagate a reset signal, which may be the same as the test signal or may be a different signal. Moreover, the reset signal may be a signal which is not propagated over an electrical circuit. For example, the reset signal may be an RF signal, WiFi signal, Bluetooth signal, or any other signal suitable for transmitting between modules located within a building to cause an indicator 140 to reset to an non-triggered condition.

Figure 3:
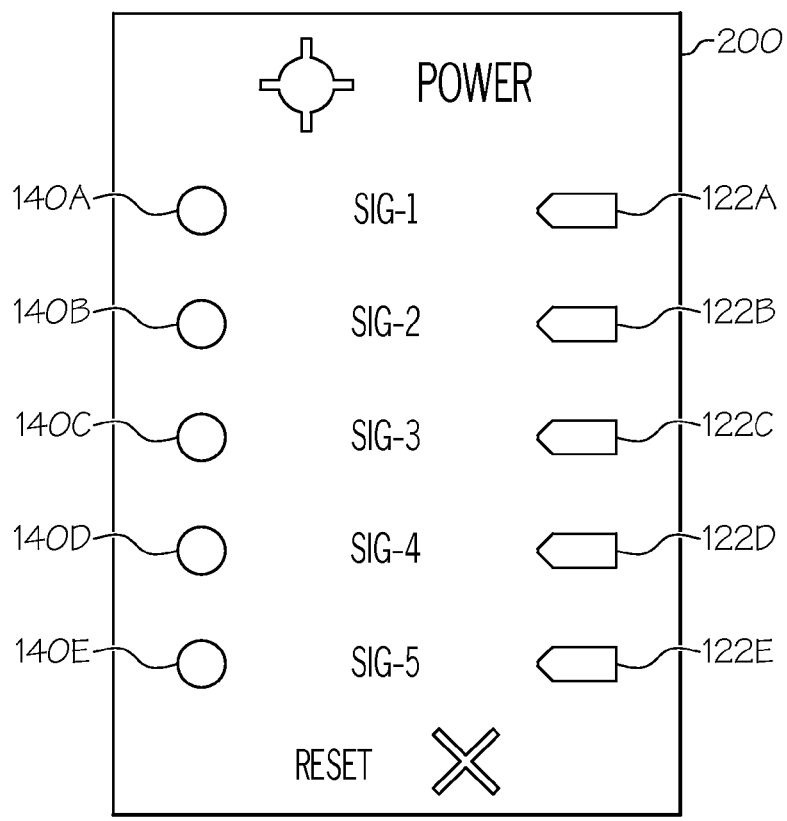
FIG. 3 is a front view of an apparatus for identifying outlets on a common power circuit according to an alternative exemplary embodiment of the present invention.

FIG. 3 shows a module 200 according to an alternate exemplary embodiment. Module 200 comprises multiple indicators 140. These indicators 140 are differentiated, such as by using different color LEDs or having different indicia (SIG-1, SIG-2, SIG-3, etc) marked adjacent each indicator. The indicators 140 are triggered by logic 130 in response to different test signals. For example, the logic 130 may trigger an indicator labeled SIG-1 in response to a test signal containing a data packet of "1". Alternatively, the logic 130 may trigger an indicator labeled SIG-1 in response to a test signal comprising a first frequency or first frequency modulation. Each other indicator 140 may be triggered by a different signal.

The embodiment of FIG. 3 also comprises multiple triggering mechanisms 122. In the illustrated exemplary embodiment, these triggering mechanisms are buttons. Each button may be electrically connected to the logic 130 such that depressing it causes logic 130 to drive the signal generator 120 to propagate a different test signal. Alternatively, each triggering mechanism may comprise a switch, such that depressing a button thereon closes a different voltage circuit in logic 130. These different voltage circuits then drive the signal generator 120 to propagate a different signal.

The alternate embodiment of FIG. 3 allows a user to simultaneously detect multiple circuits using multiple modules. That is, the user may activate a first triggering mechanism 122A on a random first module, sending a first test signal. All other modules on the same circuit as the first module will receive the first test signal and their respective first indicators 140A will be activated (e.g., illuminated). The user may then activate or trigger a second triggering mechanism 122B on a random second module that does not have an activated first indicator 140A, and therefore is not on the same circuit as the first module. The second triggering mechanism 122B on the second module will cause the signal generator of the second module to propagate a second test signal on a second circuit. All other modules on the same circuit as the second module will receive the second test signal and their respective second indicators 140B will be activated (e.g., illuminated). This pattern may be repeated until all of the modules have been activated. The user may then determine all of the outlets on each circuit.

According to another exemplary embodiment, the user may simultaneously map multiple circuits using multiple modules and a generic signal. In this embodiment, a module has multiple indicators, such as LEDs or the like, each having a triggering mechanism. A user activates a triggering mechanism associated with a first indicator. The corresponding indicator on the triggered module lights up, and all other modules that are on the same circuit receive the signal. On these modules that have received the signal, all of the indicators display an triggered state, such as blinking. The user then triggers the indicator corresponding to the current circuit.

Figure 4:
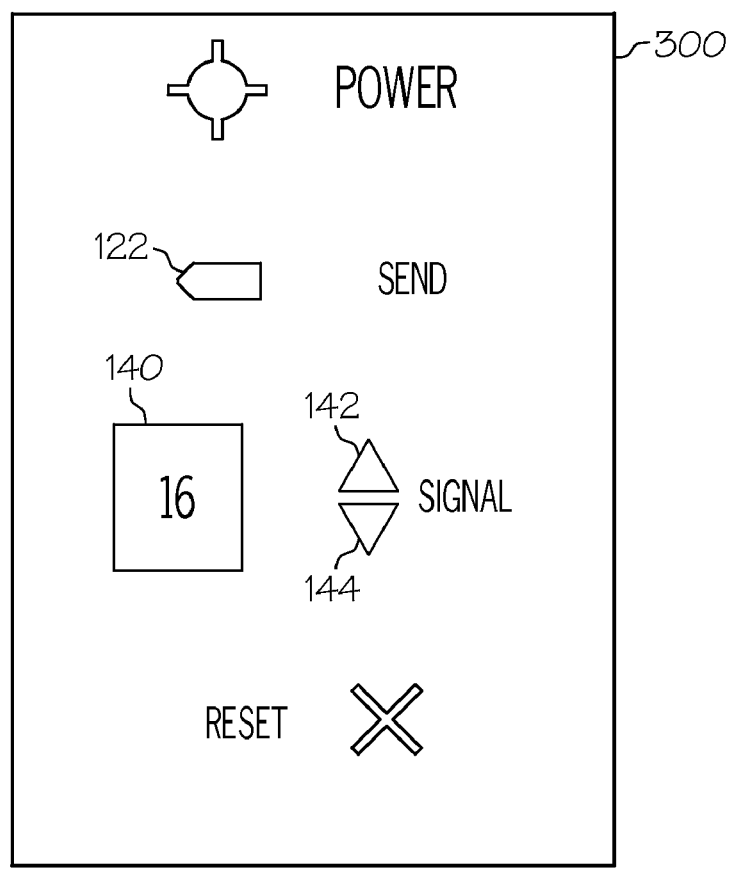
FIG. 4 is a front view of an apparatus for identifying outlets on a common power circuit according to another alternative exemplary embodiment of the present invention.

FIG. 4 shows a module 300 according to another alternate exemplary embodiment. Module 300 comprises an indicator 140 with a digital display that can present different indicia such as numbers 1, 2, 3, etc corresponding to different test signals. This module 300 may also comprise input mechanisms 142, 144 such as buttons for switching between different settings corresponding to different test signals and different indicia. For example, a user may set a first module to settings for a first test signal. This first test signal may comprise a data packet containing the symbol "1" corresponding to an indicia "1" on indicator display 140. Alternatively, the setting may be for a predefined first test signal having a predefined first frequency, amplitude, phase shift, etc.

Once the module 300 is set for a first test signal with the indicator 140 displaying the corresponding indicia, the user activates a triggering mechanism 122 to generate and send the first test signal over a first electrical circuit. All other modules on the same circuit would detect the first test signal and display the corresponding first indicia. The user may then set a module which does not display the first indicia to a second setting corresponding to a second test signal and activate the triggering mechanism 122 to send the second test signal over a second electrical circuit. All modules on this second electrical circuit would display a second indicia. This process may be repeated until all modules display an indicia, allowing the user to determine each outlet for each electrical circuit present.

According to an exemplary embodiment, a module may be adapted to electrically couple with a switch to receive a signal from another module. In this embodiment, the module is held or fastened to an electrical switch and detects a test signal using a non-contact method such as by inductance or the like. The module may be configured to alternatively plug into an outlet or to be used with an electrical switch, or different modules may be provided for use with outlets and switches.

Figure 5:
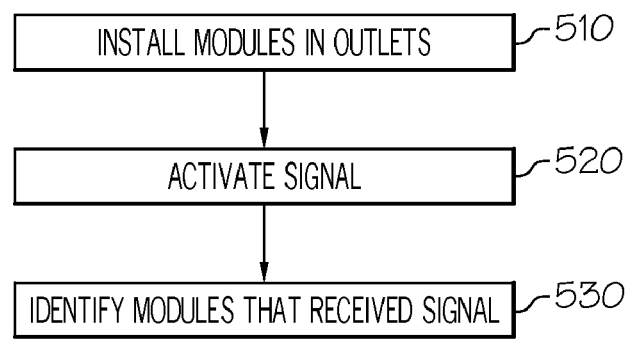
FIG. 5 is a flow diagram of a method for identifying outlets on a common power circuit according to an exemplary embodiment of the present invention.
Figure 6:
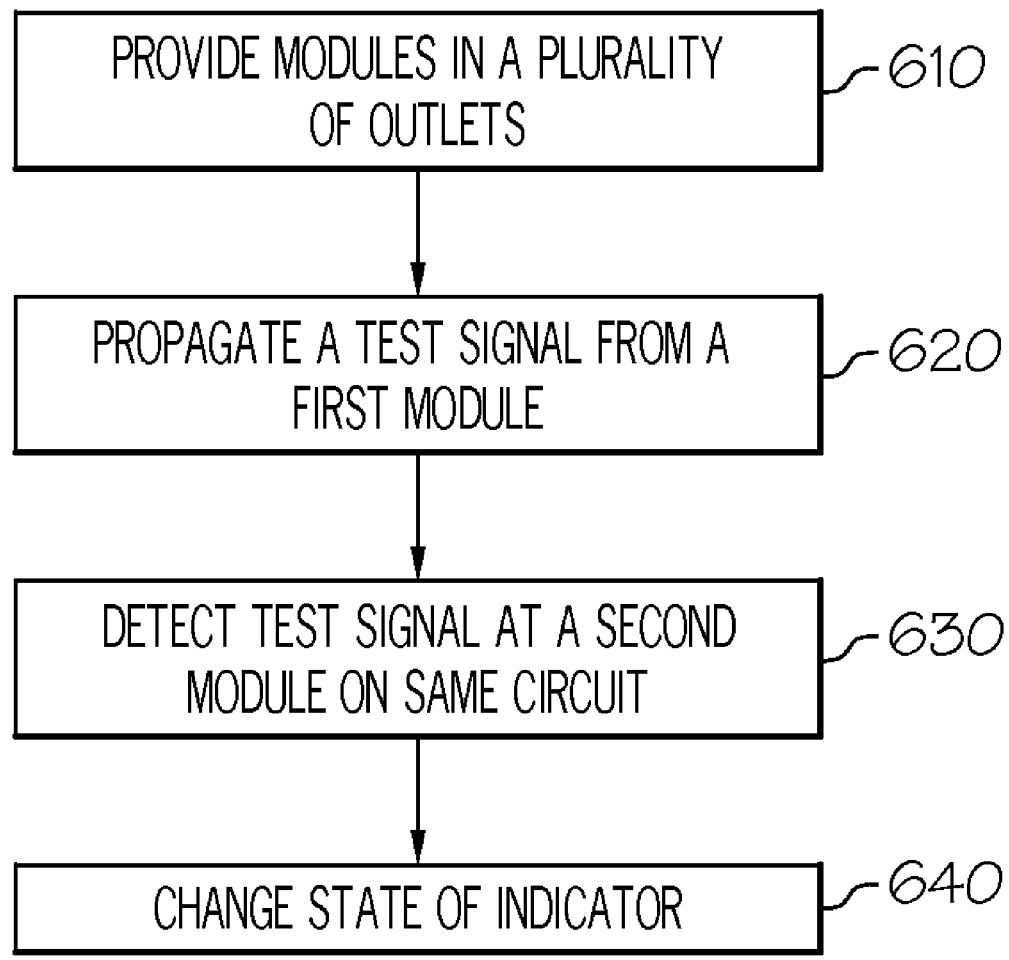
FIG. 6 is a flow diagram of a method for identifying outlets on a common power circuit according to an exemplary embodiment of the present invention.

A method for identifying outlets and/or switches on a common power circuit is shown in FIG. 5. A user, such as an electrician, for example, installs modules 100, 200, or 300 as shown in FIGS. 2A and 2B, 3, or 4 into a plurality of outlets (step 510). Modules configured to detect a signal without electrical contact, such as through inductance or the like may additionally or alternatively be installed on electrical switches. The modules may be installed in one or more rooms of a house or other building.

The user then activates a test signal on one of the modules (step 520). As described above, the signal may be activated by plugging a module into a an outlet or by triggering a trigger mechanism, such as a button operably associated with a signal generator, causing the signal generator to propagate a test signal that propagates over an electrical circuit corresponding to the outlet in which the module is installed.

The test signal is detected by other modules installed (i.e., electrically connected or inductively coupled or the like) on the same electrical circuit. The other modules on the circuit alter the state of an indicator, such as an LED or display in response to detecting the test signal.

Thus, two or more modules all of which are plugged into outlets or associated with switches communicate through a peer to peer network over the wiring of an electrical circuit. The user is not required to go to the circuit box to test each outlet. Nor is there an elaborate setup prior to performing the test. The user merely plugs two or more modules into outlets of interest and activates one of the modules.

The user then identifies the modules that received the test signal by observing the state of the indicators for the other modules (step 530). The user can then easily determine each outlet that is on the same circuit as the activated module, by observing the modules with triggered indicators.

Alternatively, the indicator 140 may be an RF transmitter or other communication device that transmits an indication that the module has received the test signal. A computer or other device may receive this transmission and provide a schematic or other record of the electrical circuit for each module.

According to an exemplary embodiment of the present invention, a user provides a plurality of modules 100, 200, 300 in a plurality of outlets (step 610). This may comprise, for example, all of the outlets within a room or in several rooms. The user may have a priori knowledge of which circuit some of the outlets are on or may alternatively lack a priori knowledge of the circuits corresponding to any of the outlets.

In response to an event, such as the user activating a triggering mechanism, a first module propagates a signal over an electrical circuit corresponding to an outlet in which the first module is installed (step 520). The signal may be any form of signal suitable for propagation over electrical wiring, and may be adapted to be uniquely identifiable, such as by providing a data packet or other identifiable characteristic (such as frequency, phase shift, or the like).

Other modules that are electrically connected to outlets on the same circuit as the first circuit receive the signal. That is, the signal enters these modules through their electrical connectors 110. Optionally, one or more modules may be coupled to the circuit without contact, such as by inductance or the like. The connectors 110 are electrically connected to logic 130. This logic detects the signal (step 530).

In response to detecting the signal, the logic changes the state of an indicator 140 in each module that receives the signal (step 540). That is, the logic 130 may open or close a voltage circuit to the indicator causing an LED in the indicator to illuminate. Alternatively, the logic may send a digital or other signal to indicator causing a display to present an indicia of a corresponding signal.

The preceding description and accompanying drawing are intended to be illustrative and not limiting of the invention. The scope of the invention is intended to encompass equivalent variations and configurations to the full extent of the following claims.

What is claimed is:

1. A plurality of modules for identifying outlets on a common power circuit, each module comprising:
   a connector adapted to electrically couple with an outlet;
   a signal generator electrically connected to said connector and adapted to send a signal through said connector into the power circuit in response to a predetermined discrete event;
   an indicator; and
   logic electrically connected to said connector and said indicator and adapted to detect a signal from another one of the plurality of modules through the common power circuit and activate said indicator in response to said signal;
   wherein the modules are only connected by the common power circuit.

2. The modules of claim 1, wherein said indicator is a light emitting diode.

3. The modules of claim 1, wherein said indicator is a liquid crystal display.

4. The modules of claim 1, wherein said indicator is a sound.

5. The modules of claim 1, wherein the predetermined discrete event comprises one of the modules being plugged into a powered outlet.

6. The modules of claim 1, wherein each module further comprises a button operably associated with the signal generator, wherein the predetermined discrete event is depressing the button.

7. The modules of claim 6, wherein each module further comprises a reset button operably associated with said indicator to reset the indicator to an off state.

8. The modules of claim 1, wherein said indicator comprises two or more indicators and said signal generator is adapted to generate two or more different signals corresponding to the indicators, and each indicator is activated only if the corresponding signal is detected.

9. The modules of claim 1, wherein said signal generator is adapted to generate two or more different signals and the indicator is a digital display adapted to present different indicia for each different signal.

10. The modules of claim 1, wherein at least one module is further adapted to electrically couple with a switch to receive a signal from another module.

11. A method for identifying outlets on a common power circuit, the method comprising the steps of:
  providing two or more modules, each module comprising a connector adapted to be connected to an outlet; a signal generator electrically connected to said connector and adapted to send a signal through said connector into the power circuit; an indicator; and logic electrically connected to said connectors and said indicator and adapted to detect a signal from another one of the two or more modules connected only through the common power circuit and activates said indicator in response to said signal;
  inserting said modules into each of a plurality of outlets;
  activating the signal generator of a first one of the two or more modules; and
  identifying outlets with modules with activated indicators as being on the same power circuit as the first module.

12. The method of claim 11, wherein the module comprising a reset mechanism associated with said indicator to reset the indicator to an off state, further comprising the step of activating the reset mechanism of a module to reset the indicator.

13. The method of claim 11, wherein said indicator comprises two or more indicators corresponding to two or more triggering mechanisms, further comprising the steps of:
  activating a second triggering mechanism on a second module; and
  identifying outlets with modules with activated second indicators as being on the same circuit as the second module.

14. The method of claim 11, further comprising at least one module adapted to electrically couple with a switch to receive a signal from another module.

15. A method for identifying outlets on a common power circuit, the method comprising the steps of:
  providing two or more modules, each module comprising a connector adapted to be connected to an outlet; a signal generator electrically connected to said connector and adapted to send a signal through said connector into the power circuit; an indicator; and logic electrically connected to said connectors and said indicator and adapted to detect a signal from another one of the two or more modules through the common power circuit and activates said indicator in response to said signal;
  inserting said modules into each of a plurality of outlets;
  activating the signal generator of a first one of the two or more modules; and
  identifying outlets with modules with activated indicators as being on the same power circuit as the first module;
  wherein said signal generator is adapted to generate two or more different signals and the indicator is a digital display adapted to present different indicia for each different signal, further comprising the steps of:
  prior to activating the signal generator, selecting a signal by setting a corresponding indicia; and
  wherein identifying outlets with modules with activated indicators comprises identifying only those outlets with modules with indicators displaying the corresponding indicia.

16. The method of claim 15, further comprising the steps of:
  selecting a signal by setting a corresponding second indicia on a second module that is not activated by the first signal;
  activating the signal generator on said second module; and
  identifying outlets with modules with indicators displaying said second indicia as being on the same circuit as the second module.

* * * * *